United States Patent
Zhang et al.

(10) Patent No.: US 9,450,616 B2
(45) Date of Patent: Sep. 20, 2016

(54) ADAPTIVE CODED-MODULATION FOR INTELLIGENT OPTICAL TRANSPORT NETWORKS

(71) Applicant: NEC Laboratories America, Inc., Princeton, NJ (US)

(72) Inventors: Shaoliang Zhang, Plainsboro, NJ (US); Ting Wang, West Windsor, NJ (US); Yequn Zhang, Tucson, AZ (US); Lei Xu, Princeton Junction, NJ (US)

(73) Assignee: NEC Corporation (JP)

( * ) Notice: Subject to any disclaimer, the term of this patent is extended or adjusted under 35 U.S.C. 154(b) by 14 days.

(21) Appl. No.: 14/567,321

(22) Filed: Dec. 11, 2014

(65) Prior Publication Data
US 2015/0162937 A1 Jun. 11, 2015

Related U.S. Application Data

(60) Provisional application No. 61/914,501, filed on Dec. 11, 2013.

(51) Int. Cl.
*H03M 13/00* (2006.01)
*H03M 13/35* (2006.01)
*H03M 13/11* (2006.01)
*H03M 13/29* (2006.01)

(52) U.S. Cl.
CPC ........ *H03M 13/353* (2013.01); *H03M 13/1171* (2013.01); *H03M 13/2906* (2013.01); *H03M 13/6508* (2013.01)

(58) Field of Classification Search
CPC ......... H03M 13/353; H03M 13/1171; H03M 13/2906; H03M 13/6508
See application file for complete search history.

(56) References Cited

U.S. PATENT DOCUMENTS

| | | | |
|---|---|---|---|
| 8,301,965 B2* | 10/2012 | Wu | H04L 1/0041 714/755 |
| 2006/0107169 A1* | 5/2006 | Vedantham | H04L 1/004 714/752 |
| 2008/0204286 A1* | 8/2008 | Kose | H03M 13/1102 341/67 |
| 2010/0248643 A1* | 9/2010 | Aaron | H04L 1/0002 455/68 |

* cited by examiner

*Primary Examiner* — Sam Rizk
(74) *Attorney, Agent, or Firm* — Joseph Kolodka

(57) ABSTRACT

A computer implemented method for dynamic data rate adjustment within a cascaded forward error correction FEC for optical communications includes subjecting data communicated over an optical network to a forward error correction in an encoding or decoding of the data, the encoding or decoding employing a codeword, re-encoding part of the codeword for generating a subsequent codeword where an actual code rate is tuned by adjusting a size of data encoded to provide re-encoded data, and dynamically changing the re-encoded data size to achieve cascaded rate adaptive FEC for communication of the data over the optical network.

12 Claims, 3 Drawing Sheets

ADAPTIVE CODED-MODULATION FOR INTELLIGENT OPTICAL TRANSPORT NETWORKS

RELATED APPLICATION INFORMATION

This application claims priority to provisional application No. 61/914,501 filed Dec. 11, 2013, entitled "Adaptive Coded-Modulation for Intelligent Optical Transport Networks", the contents thereof are incorporated herein by reference

BACKGROUND OF THE INVENTION

The present invention relates generally to optical networks, and more particularly, to adaptive coded-modulation for intelligent optical transport networks.

The following references are referred to in this background discussion:
[1] M. Arabaci, I. B. Djordjevic, R. Saunders, and R. M. Marcoccia, "Polarization-multiplexed rate-adaptive non-binary-LDPC-coded multilevel modulation with coherent detection for optical transport networks," Optics Express, vol. 18, pp. 1820-1832, January 2010.
[2] I. B. Djordjevic, "Adaptive LDPC-Coded Multilevel Modulation with Coherent Detection for High-Speed Optical Transmission," IEEE Photonics Society Summer Topicals 2009, 20-22 Jul. 2009, Newport Beach, Calif., Paper no. WC1. 2.
[3] I. B. Djordjevic, M. Arabaci, and L. Minkov, "Next Generation FEC for High-Capacity Communication in Optical Transport Networks," IEEE/OSA J. Lightw. Technol., vol. 27, no. 16, pp. 3518-3530, Aug. 15, 2009.

Future intelligent optical transport networks (OTNs) should possess the capability of dynamic data rate adjustment. One solution is to adjust data rate by changing the overhead of the adopted forward-error-correction (FEC) codes while keeping other system configurations unchanged. Meanwhile, to meet the increasing high demand on data rate, low-density-parity-check (LDPC) codes have been proved to be promising candidates for high-speed OTNs. Therefore rate-adaptive LDPC-coded modulation [1,2], becomes an essential component for the future OTNs.

Rate-adaptive techniques based on LDPC codes being able to adjust data rate dynamically by changing the overhead of LDPC codes have been proposed recently in [1,2]. However, since low-density parity-check LDPC codes with different overheads and code rates have been used, the transmitter and receiver have to be designed to support all the LDPC codes resulting in very high complexity and costs of hardware. Although quasi-cyclic LDPC (QC-LDPC) codes can be used to reduce the encoder and decoder hardware complexity with minimal cost [3], no practical solution has yet been proposed to reduce the complexity of the rate-adaptive LDPC-coded modulation schemes.

Accordingly, there is a need for adaptive coded-modulation for intelligent optical transport networks.

BRIEF SUMMARY OF THE INVENTION

The invention is directed to a computer implemented method for dynamic data rate adjustment within a cascaded forward error correction FEC for optical communications that includes subjecting data communicated over an optical network to a forward error correction in an encoding or decoding of the data, the encoding or decoding employing a codeword, re-encoding part of the codeword for generating a subsequent codeword where an actual code rate is tuned by adjusting a size of data encoded to provide re-encoded data, and dynamically changing the re-encoded data size to achieve cascaded rate adaptive FEC for communication of the data over the optical network.

In a similar aspect of the invention there is provided a non-transitory storage medium with instructions for a computer to implement a method for dynamic data rate adjustment within a cascaded forward error correction FEC for optical communications that includes subjecting data communicated over an optical network to a forward error correction in an encoding or decoding of the data, the encoding or decoding employing a codeword, re-encoding part of the codeword for generating a subsequent codeword where an actual code rate is tuned by adjusting a size of data encoded to provide re-encoded data, and dynamically changing the re-encoded data size to achieve cascaded rate adaptive FEC for communication of the data over the optical network.

These and other advantages of the invention will be apparent to those of ordinary skill in the art by reference to the following detailed description and the accompanying drawings.

DETAILED DESCRIPTION

The present invention is directed to a computer implemented method for cascaded FEC-based rate-adaptive modulation that relies on only a single pre-designed low-density parity-check LDPC code with a specific code rate R. the invention leverages re-encoding encoded data to achieve the rate-adaptive functionality instead of needing a set of LDPC codes of different code rates. It is shown that by re-encoding the encoded data and correspondingly performing cascaded decoding with enhanced log-likelihood ratios (LLRs), the error-correction capability of the proposed technique can be increased. Such feature is suitable for dynamic data rate adjustment when channel fidelity changes or transmission reach requirement varies. When the actual code rate R' satisfies R'≤R with equality than no data is re-encoded.

Figure 1:
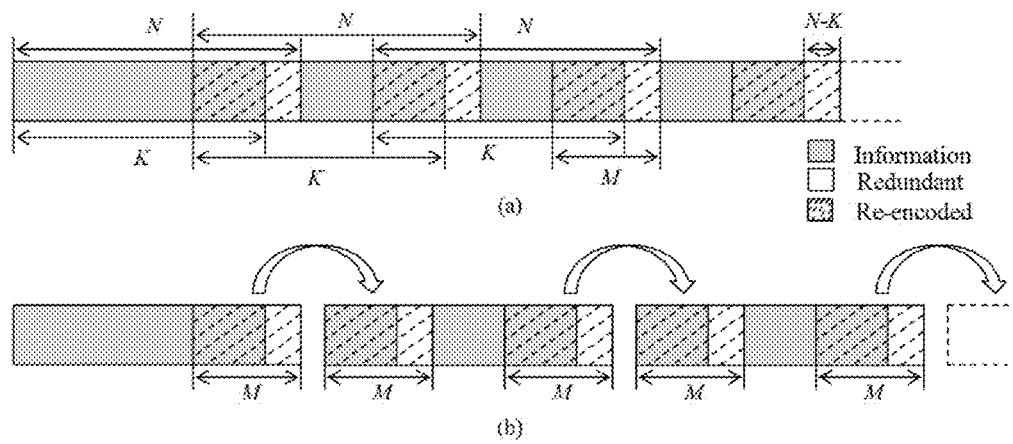
FIG. 1 is a diagram depicting a principle of cascaded forward error correction FEC rate adaptive scheme: (a) encoding and (b) decoding.

Many forward-error-correction FEC codes can be used as a component code of the inventive cascaded rate-adaptive modulation for optical transport networks and other optical systems. FIG. 1 illustrates the principle of cascaded FEC-based rate-adaptive scheme: (a) encoding and (b) decoding. We describe the invention using a regular (N, K) nonbinary LDPC code as a component code, with G as the generator matrix and H as the parity-check matrix. Decoding of low-density parity-check LDPC codes uses the logarithm-domain sum-product algorithm (SPA) to avoid instability issue. SPA in the nonbinary LDPC decoder uses symbol log-likelihood ratios (LLRs) as the input and iterates the extrinsic information between variable and check nodes of the bipartite graph representation of H. The decoder outputs the converged or enhanced symbol LLRs which are used to make decisions and count errors. The proposed rate-adaptive scheme is given below.

Figure 2:
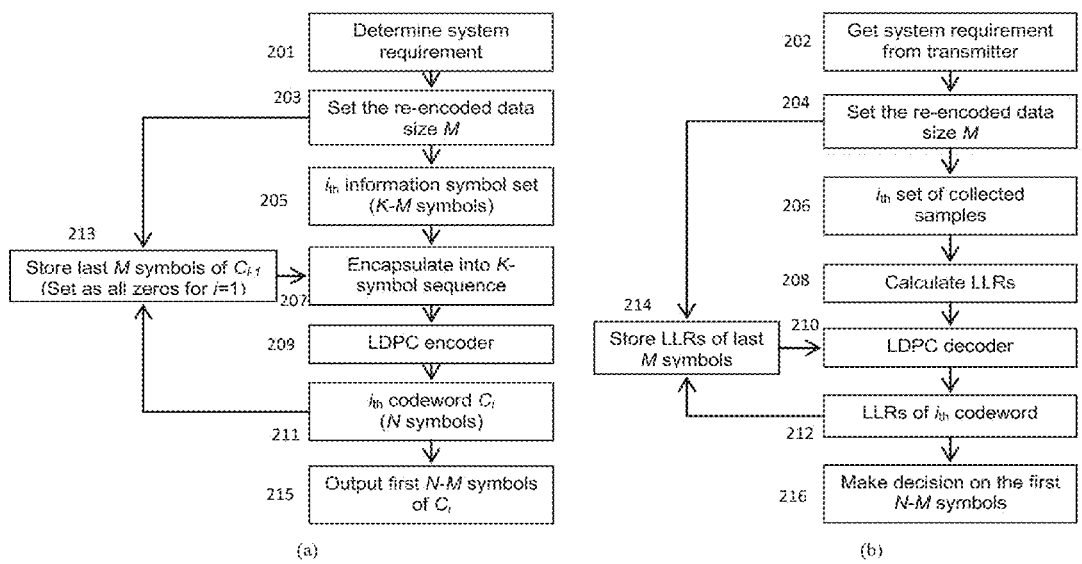
FIG. 2 is a diagram showing cascaded a FEC-based rate-adaptive application, (a) encoding and (b) decoding, according to the invention.

FIG. 2 depicts cascaded FEC-based rate-adaptive steps consistent with the teachings of the invention. On the encoding side, FIG. 2(a), system requirements are determined 201, the re-encoded data size M is set 203. The $i_{th}$ information symbol set (K−M symbols) 205 is encapsulated into a K-symbol sequence 207, followed by LDPC encoding 209 with the $i_{th}$ codeword $C_i$ (N symbols) 211 and first N-M symbols of $C_i$ being output. Steps 203 and 211 feed forward and feedback to, respectively, to step 213 where there is a storing of last M symbols of Ci−1 (set as all zeros for i=1). On the decoding side, FIG. 2 (b), system requirements are obtained from the transmitter 202, re-encoded data size M is set. From an $i_{th}$ set of collected samples, step 206, log likelihood ratios LLRs are calculated 208 and fed to an LDPC decoder 210. LLRs of the $i_{th}$ codeword are determined 212 and then a decision is made on the first N-M symbols 216. A feed forward and feedback step 214 stores LLRs of last M symbols.

Cascaded FEC-Based Rate-Adaptive Scheme

The transmitter contains a (N, K) nonbinary LDPC code with the code rate R=K/N. A row vector of K information symbols is denoted as u. The encoder of the component nonbinary LDPC code generates a codeword c of N symbols according to Equation (1): c=uG (1), where G is a K×N matrix composed of elements from the corresponding Galois field GF(q) while q is chosen to be the constellation size [1].

The cascaded LDPC encoder generates the $1^{st}$ codeword by multiplying a vector of M zeros and K−M information symbols with G. To generate the $2^{nd}$ codeword, the encoder first encapsulates the last M symbols of the first codeword and (K−M) incoming information symbols into a K-symbol sequence and then multiplies the K-symbol sequence with G. All the following codewords are generated in such a cascaded way by re-encoding the last M symbols of its previous codeword as shown in FIG. 2 (a). The cascaded encoding process can thus be represented by Equation (2) as $c_i = u_i \cdot G$ (2), where $c_i = (c_{i,1} \ c_{i,2} \ \ldots \ c_{i,M} \ c_{i,M+1} \ \ldots \ c_{i,N-1} \ c_{i,N}) = (c_{i-1,N-M+1} \ c_{i-1,N-M+2} \ \ldots \ c_{i-1,N} \ c_{i,M+1} \ \ldots \ c_{i,N-1} \ c_{i,N})$ and $u_i = (c_{i-1,N-M+1} \ c_{i-1,N-M+2} \ \ldots \ c_{i-1,N} \ u_{i,1} \ \ldots \ u_{i,N-M-1} \ u_{i,N-M})$ denote the $i^{th}$ codeword produced and the corresponding information sequence used for encoding and M denotes the number of symbols re-encoded. Obviously, the cascaded LDPC encoder does not change the encoder configuration of its component code; the re-encoded M symbols $(c_{i-1,N-M+1} \ c_{i-1,N-M+2} \ \ldots \ c_{i-1,N})$ will not be transmitted resulting the actual code rate as R'=(K−M)/(N−M).

The inventive cascaded rate-adaptive modulation method operates by adjusting the value of M according to real-time system status, either channel fidelity or transmission reach. M can be an arbitrary positive number no larger than K and the actual code rate R'=(K−M)/(N−M)≤R. While the optical channel is good enough, M is set to be zero where no previous symbol is re-encoded and the proposed scheme reduces to nonbinary LDPC-coded modulation (NB-LDPC-CM) [1]. The actual code rate is R'=R=K/N. When the channel worsens, according to the real-time optical-signal-to-noise ratio (OSNR) requirement, M is set to be a proper positive integer to guarantee the transmission reliability. The error-correction capability of the proposed scheme increases as M goes up.

At the receiver side, since M symbols are re-encoded during encoding and systematic LDPC code is adopted, decoding of a codeword requires both the M symbol LLRs produced by the decoding of the previous codeword and the initial symbol LLRs of the received K−M complex samples as shown in FIG. 2(b). Denote the LDPC decoder as L=D(l), where soft-information-based message passing algorithm is employed and $l=(l_1 l_2 l_3 \ldots l_N)$ and $L=(L_1 \ L_2 \ L_3 \ \ldots \ L_N)$ denote the input and output soft information sequence of length N. The cascaded LDPC decoding of the $i^{th}$ codeword is described as: $L_i = D(l_i)$ (3), where $L_i = (L_{i,1} \ L_{i,2} \ L_{i,3} \ \ldots \ L_{i,N})$ and $l_i(l_{i,1} \ l_{i,2} \ l_{i,3} \ \ldots \ l_{i,N}) = (L_{i-1,N-M+1} \ L_{i-1,N-M+2} \ \ldots \ L_{i-1,N} \ l_{i,M+1} \ l_{i,M+2} \ \ldots \ l_{i,N})$ represent the corresponding decoder output and input soft information (LLRs).

The M symbol LLRs $(L_{i-1,N-M+1} \ L_{i-1,N-M+2} \ \ldots \ L_{i-1, N})$ from the decoding of the previous codeword can be regarded as enhanced symbol LLRs and help improve the error-correction capability since they are produced by SPA and have higher confidence.

Figure 3:
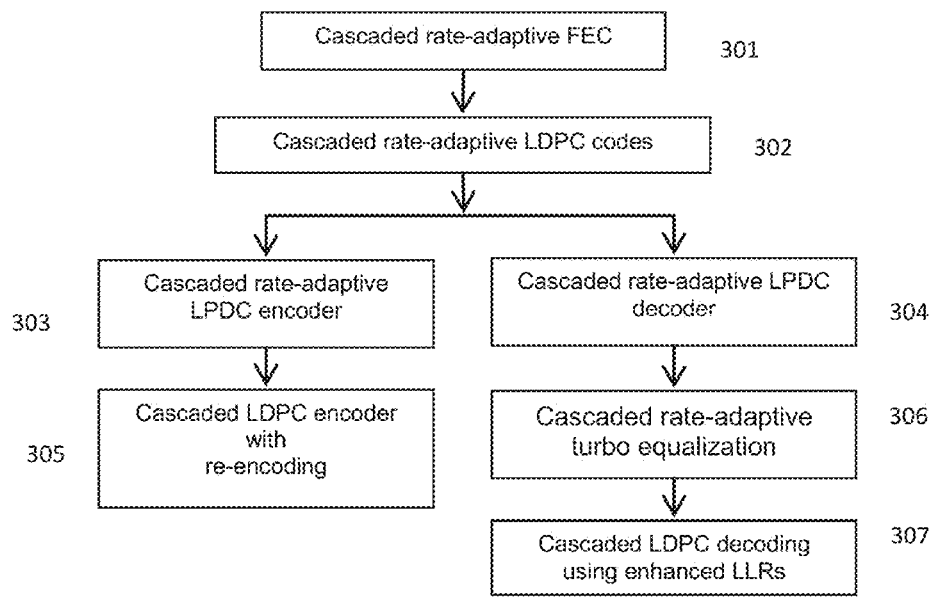
FIG. 3 is a diagram showing aspects of the inventive rate adaptive coding in an optical transport system, according to the invention.

FIG. 3 is a diagram showing aspects of the inventive rate adaptive according to the invention. The cascaded rate adaptive FEC 301 employs a cascaded rate adaptive LDPC code as a component code 302. On the encoding side 303, 305 the cascaded rate adaptive LDPC encoder is followed by re-encoding. On the decoder side 304, 306, 307 the cascaded rate-adaptive LDPC decoder is followed by cascaded rate-adaptive turbo equalization and then cascaded LDPC decoding using enhanced LLRs.

The cascaded rate adaptive FEC is employed to leverage re-encoding and a systematic form of FEC part of a codeword is re-encoded in the process of generating the subsequent codeword where the actual code rate is tuned by adjusting the size of data re-encoded. A cascaded FEC code uses an LDPC code as the component code. Such encoder utilizes the re-encoding and can dynamically change the re-encoded data size. For such decoder, when decoding uses part of the decoding output, the amount of decoding which can be adjusted is according to the size of re-encoded data. When turbo equalization is employed, such turbo equalizer adjusts the length of the sample sequence according to the size of re-encoded data. Re-encoded data in a codeword no longer needs equalization.

The invention may be implemented in hardware, firmware or software, or a combination of the three. Preferably the invention is implemented in a computer program executed on a programmable computer having a processor, a data storage system, volatile and non-volatile memory and/or storage elements, at least one input device and at least one output device. More details are discussed in U.S. Pat. No. 8,380,557, the content of which is incorporated by reference.

Figure 4:
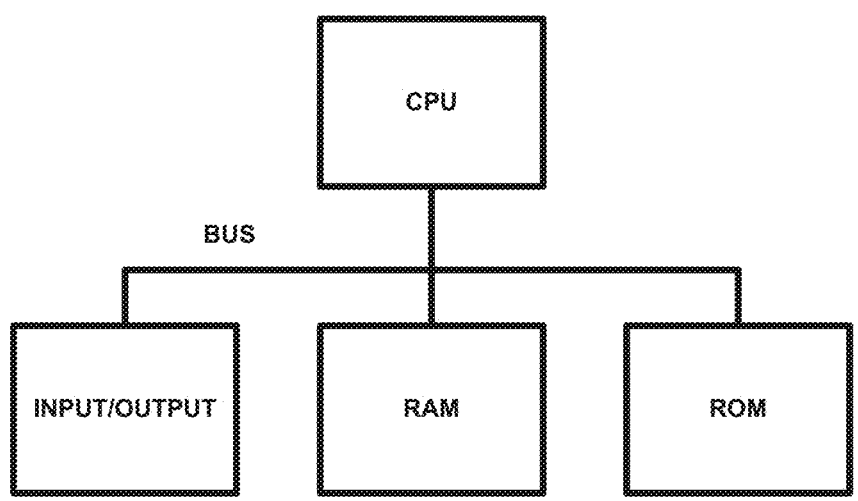
FIG. 4 shows an exemplary computer to perform the inventive rate adaptive coding.

By way of example, a block diagram of a computer to support the system is discussed next in FIG. 4. The computer preferably includes a processor, random access memory (RAM), a program memory (preferably a writable read-only memory (ROM) such as a flash ROM) and an input/output (I/O) controller coupled by a CPU bus. The computer may optionally include a hard drive controller which is coupled to a hard disk and CPU bus. Hard disk may be used for storing application programs, such as the present invention, and data. Alternatively, application programs may be stored in RAM or ROM. I/O controller is coupled by means of an I/O bus to an I/O interface. I/O interface receives and transmits data in analog or digital form over communication links such as a serial link, local area network, wireless link, and parallel link. Optionally, a display, a keyboard and a pointing device (mouse) may also be connected to I/O bus. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

The cascaded rate-adaptive FEC is suitable for the future intelligent optical transport networks OTNs, wherein the component FEC code could be hard-decision, soft-decision, binary or nonbinary. The FEC code should be systematic. In cascaded rate-adaptive LDPC encoder, encoding is based on a single code rate LDPC code. Configuration of the LDPC encoder is unchanged and only the input to the encoder is dynamically scheduled. The actual code rate is adjusted by changing the re-encoded data amount according to the real-time system requirement. In cascaded LDPC encoder with re-encoding, part of the coded data of the previous codeword along with incoming information data is encoded into a new codeword. In cascaded rate-adaptive LDPC decoder, the decoder configuration is fixed. Only the decoder input is dynamically scheduled to be consistent with the encoder. The decoder input consists of enhanced LLRs of re-encoded data and LLRs calculated with newly received samples. In cascaded rate-adaptive turbo equalization, maximum a posteriori (MAP) detector only works on the samples corresponding to the non-re-encoded symbols of the current codeword. LLRs of the re-encoded symbols stored in registers are directly forwarded to the LPDC decoder together with the MAP detector output LLRs to decode the current codeword. In cascaded LDPC decoding using enhanced LLRs, LLRs produced from the decoding of the previous codeword are stored in registers for the decoding the following codeword and help improve the error-correction capability.

From the foregoing, it can be appreciated that with the present invention the hardware complexity and cost is very low compared to the existing rate-adaptive schemes. Other FEC codes not only LDPC code can also be applied to the proposed cascaded FEC-based rate-adaptive scheme. The invention can adjust the code rate to any value lower than R and hence data rate can be adjusted continuously instead of discretely.

Furthermore, based on the existing optical communication systems with FEC, the inventive cascaded FEC-based rate-adaptive method incurs trivial hardware complexity and cost to support the rate-adaptive functionality for the future OTNs. The invention is suitable for the future intelligent high-speed OTNs when using large-girth LDPC code as the component code.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention.

Those skilled in the art could implement various other feature combinations without departing from the scope and spirit of the invention.

The invention claimed is:

1. A computer implemented method for dynamic data rate adjustment within a cascaded forward error correction FEC for optical communications, the method comprising the steps of:
    i) subjecting data communicated over an optical network to a forward error correction in an encoding or decoding of the data, the encoding or decoding employing a codeword;
    ii) re-encoding part of the codeword for generating a subsequent codeword where an actual code rate is tuned by adjusting a size of data encoded to provide re-encoded data; and
    iii) dynamically changing the re-encoded data size to achieve cascaded rate adaptive FEC for communication of the data over the optical network;
    wherein the encoding comprises a cascaded low-density parity-check LDPC encoder that generates a $1^{st}$ codeword by multiplying a vector of M zeros and K−M information symbols with G, using a regular (N, K) nonbinary LDPC code as a component code G denotes a generator matrix; and wherein to generate the $2^{nd}$ codeword, the encoder first encapsulates the last M symbols of the first codeword and (K−M) incoming information symbols into a K-symbol sequence and then multiplies the K-symbol sequence with G.

2. The method of claim 1, wherein the encoding includes a (N, K) nonbinary LDPC code with a code rate R=K/N, where a row vector of K information symbols is denoted as u, and an encoder of the component nonbinary LDPC code generates the codeword c of N symbols according to c=u·G where G is a K×N matrix composed of elements from a corresponding Galois field GF(q) while q is chosen to be a constellation size.

3. The method of claim 1, wherein all the codewords following generation of the $2^{nd}$ codeword are generated in such a cascaded way by re-encoding the last M symbols of its previous codeword.

4. The method of claim 1, wherein step iii) comprises adjusting a value of M according to real-time system status, where M denotes a number of symbols re-encoded, M can be an arbitrary positive number no larger than K information symbols and an actual code rate R'=(K−M)/(N−M)≤R, where R is a an unadjusted code rate.

5. The method of claim 4, wherein M is set to be zero where no previous symbol is re-encoded and the actual code rate is R'=R=K/N, K representing information symbols and N representing a number of symbols generated by the codeword.

6. The method of claim 1, wherein responsive to real-time optical-signal-to-noise ratio (OSNR) requirement in the optical network, M is set to be a proper positive integer to guarantee a transmission reliability with an error-correction capability increasing as M goes up.

7. A non-transitory storage medium with instructions for enabling a computer to implement a method for dynamic data rate adjustment within a cascaded forward error correction FEC for optical communications, the method comprising the steps of:
    i) subjecting data communicated over an optical network to a forward error correction in an encoding or decoding of the data, the encoding or decoding employing a codeword;

ii) re-encoding part of the codeword for generating a subsequent codeword where an actual code rate is tuned by adjusting a size of data encoded to provide re-encoded data; and iii) dynamically changing the re-encoded data size to achieve cascaded rate adaptive FEC for communication of the data over the optical network;

wherein to generate the $2^{nd}$ codeword, the encoder first encapsulates the last M symbols of the first codeword and (K−M)incoming information symbols into a K-symbol sequence and then multiplies the K-symbol sequence with G; and wherein the encoding comprises a cascaded low-density parity-check LDPC encoder that generates a $1^{st}$ codeword by multiplying a vector of M zeros and K−M information symbols with G, using a regular (N, K) nonbinary LDPC code as a component code G denotes a generator matrix.

8. The storage medium of claim 7, wherein the encoding includes a (N, K) nonbinary LDPC code with a code rate R=K/N, where a row vector of K information symbols is denoted as u, and an encoder of the component nonbinary LDPC code generates the codeword c of N symbols according to c=u·G where G is a K×N matrix composed of elements from a corresponding Galois field GF(q) while q is chosen to be a constellation size.

9. The storage medium of claim 7, wherein all the codewords following generation of the $2^{nd}$ codeword are generated in such a cascaded way by re-encoding the last M symbols of its previous codeword.

10. The storage medium of claim 7, wherein step iii) comprises adjusting a value of M according to real-time system status, where M denotes a number of symbols re-encoded, M can be an arbitrary positive number no larger than K information symbols and an actual code rate R'=(K−M)/(N−M)≤R, where R is a an unadjusted code rate.

11. The storage medium of claim 10, wherein M is set to be zero where no previous symbol is re-encoded and the actual code rate is R'=R=K/N, K representing information symbols and N representing a number of symbols generated by the codeword.

12. The storage medium of claim 7, wherein, wherein responsive to real-time optical-signal-to-noise ratio (OSNR) requirement in the optical network, M is set to be a proper positive integer to guarantee a transmission reliability with an error-correction capability increasing as M goes up.

* * * * *